(12) United States Patent
Daly et al.

(10) Patent No.: US 10,268,464 B2
(45) Date of Patent: Apr. 23, 2019

(54) TECHNOLOGIES FOR NETWORK APPLICATION PROGRAMMING WITH FIELD-PROGRAMMABLE GATE ARRAYS

(71) Applicant: Intel Corporation, Santa Clara, CA (US)

(72) Inventors: Daniel P. Daly, Ann Arbor, MI (US); Thomas E. Willis, Redwood City, CA (US); Pat Wang, San Jose, CA (US); Vishal Anand, San Jose, CA (US); Hung Nguyen, San Jose, CA (US); Varsha Apte, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/644,150

(22) Filed: Jul. 7, 2017

(65) Prior Publication Data

US 2019/0012156 A1 Jan. 10, 2019

(51) Int. Cl.
 *G06F 8/41* (2018.01)
 *G06F 8/51* (2018.01)
 *G11C 15/04* (2006.01)
 *G11C 11/412* (2006.01)

(52) U.S. Cl.
 CPC ........... *G06F 8/51* (2013.01); *G06F 8/41* (2013.01); *G06F 8/443* (2013.01); *G06F 8/447* (2013.01); *G11C 11/412* (2013.01); *G11C 15/04* (2013.01)

(58) Field of Classification Search
 CPC .............. G06F 8/41; G06F 8/51; G06F 8/447
 USPC .................................................. 717/137, 140
 See application file for complete search history.

(56) References Cited

U.S. PATENT DOCUMENTS

| | | | |
|---|---|---|---|
| 6,114,873 A * | 9/2000 | Sahraoui | G06F 7/505 326/39 |
| 8,473,904 B1 * | 6/2013 | Sundararajan | G06F 12/00 711/118 |
| 9,223,921 B1 | 12/2015 | Carrillo et al. | |
| 2004/0143801 A1 | 7/2004 | Waters et al. | |
| 2013/0263082 A1 | 10/2013 | Lin | |

(Continued)

OTHER PUBLICATIONS

Jamieson et al., A Verilog RTL Synthesis Tool for Heterogeneous FPGAS, 2005, IEEE, 305-310 (Year: 2005).*

(Continued)

*Primary Examiner* — Phillip H Nguyen
(74) *Attorney, Agent, or Firm* — Barnes & Thornburg LLP

(57) ABSTRACT

Technologies for network application programming include a computing device that analyzes a network application source program. The source program includes a declarative description of a network application in a domain-specific language, such as P4. The computing device translates the declarative description of the network application into a register-transfer level (RTL) description, and then compiles the RTL description into a bitstream definition that is targeted to an FPGA. For example, the computing device may generate a parse graph based on the network application source program, and then generate an RTL TCAM-SRAM structure for each node of the parse graph. The computing device may optimize the RTL description, for example by simplifying RTL structures or removing unused logic. The computing device may program an FPGA with the bitstream definition. Other embodiments are described and claimed.

25 Claims, 4 Drawing Sheets

(56) References Cited

U.S. PATENT DOCUMENTS

| | | | |
|---|---|---|---|
| 2014/0101636 A1* | 4/2014 | Correll | G06F 8/34 717/113 |
| 2015/0254353 A1* | 9/2015 | Gulwani | G06F 17/30864 707/706 |
| 2017/0068751 A1 | 3/2017 | Bulusu et al. | |
| 2017/0102943 A1* | 4/2017 | Voellmy | G06F 8/41 |
| 2018/0054359 A1* | 2/2018 | Abel | G06F 9/4416 |

OTHER PUBLICATIONS

Nikhil, Bluespec SystemVerilog: Efficient, Correct RTL from High-Level Specifications, 2004, IEEE, 69-70 (Year: 2004).*

Bonatto et al., DDR-SDRAM Memory Controller Validation for FPGA Synthesis, 2008, IEEE, 9th IEEE Latin-American Test Workshop, 177-182 (Year: 2008).*

Mounika et al., Design and Implementation of TCAM using Reversible Logic, 2016, International Journal for Innovative Research in Multidisciplinary Field, vol. 2, 299-304 (Year: 2016).*

Lekshmipriya et al., FPGA Based Architecture for High Performance SRAM Based TCAM for Search Operations, 2015, International Journal of Science and Research, vol. 4, 1862-1867 (Year: 2015).*

Ullah et al., FPGA Implementation of SRAM-based Ternary Content Addressable Memory, 2012, IEEE, IEEE 26th International Parallel and Distributed Processing Symposium Workshops & PhD Forum, 383-389 (Year: 2012).*

Bosshart et al., Programming Protocol-Independent Packet Processors, 2014, ACM SIGCOMM Computer Communication Review, vol. 44, 87-95 (Year: 2014).*

Wang et al., P4FPGA : A Rapid Prototyping Framework for P4, Apr. 2017, SOSR (Year: 2017).*

Le Roux, "Bitstreann specialisation for dynamic reconfiguration of real-time applications" (Year: 2014).*

International search report for PCT application No. PCT/US2018/036449, dated Sep. 27, 2018 (3 pages).

Written opinion for PCT application No. PCT/US2018/036449, dated Sep. 27, 2018 (6 pages).

Wesley G. Peck, 'Hardware/Software Co-Design via Specification Refinement', PhD dissertation, University of Kansas, pp. 1-173, Dec. 31, 2011 Retrieved from <https://kuscholarworks.ku.edu/handle/1808/9769> See pp. 20, 39, 48, 67, 119.

* cited by examiner

TECHNOLOGIES FOR NETWORK APPLICATION PROGRAMMING WITH FIELD-PROGRAMMABLE GATE ARRAYS

BACKGROUND

Modern computing devices may include general-purpose processor cores as well as a variety of hardware accelerators for performing specialized tasks. Certain computing devices may include one or more field-programmable gate arrays (FPGAs), which may include programmable digital logic resources that may be configured by the end user or system integrator. In some computing devices, an FPGA may be used to perform network packet processing tasks instead of using general-purpose compute cores.

P4 is a declarative programming language that may be used to specify how a network switch processes packets. P4 programs have been targeted to execution on FPGAs by building a fully flexible, programmable packet processing pipeline in gates on the FPGA and then compiling the P4 program to be executed by that packet processing pipeline.

BRIEF DESCRIPTION OF THE DRAWINGS

The concepts described herein are illustrated by way of example and not by way of limitation in the accompanying figures. For simplicity and clarity of illustration, elements illustrated in the figures are not necessarily drawn to scale. Where considered appropriate, reference labels have been repeated among the figures to indicate corresponding or analogous elements.

DETAILED DESCRIPTION OF THE DRAWINGS

Figure 1:
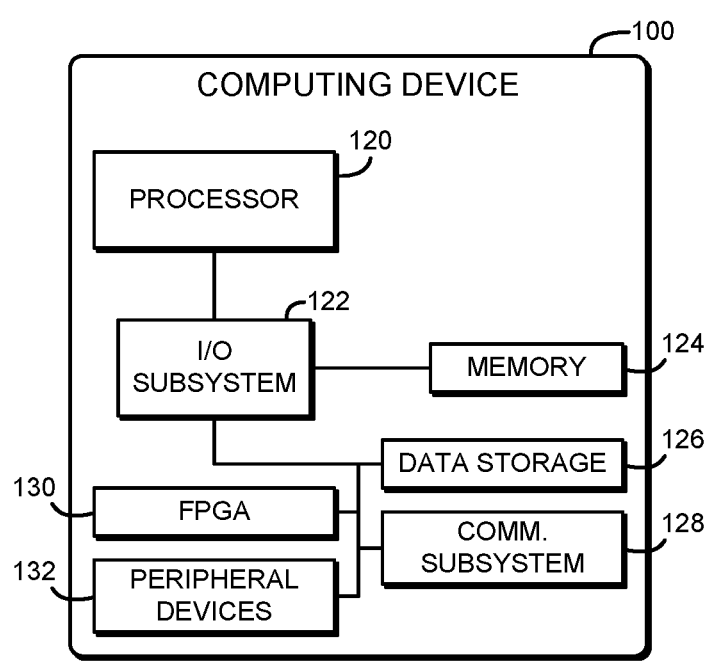
FIG. 1 is a simplified block diagram of at least one embodiment of a computing device for network programming with a field-programmable gate array.

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Additionally, it should be appreciated that items included in a list in the form of "at least one A, B, and C" can mean (A); (B); (C); (A and B); (A and C); (B and C); or (A, B, and C). Similarly, items listed in the form of "at least one of A, B, or C" can mean (A); (B); (C); (A and B); (A and C); (B and C); or (A, B, and C).

The disclosed embodiments may be implemented, in some cases, in hardware, firmware, software, or any combination thereof. The disclosed embodiments may also be implemented as instructions carried by or stored on a transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

Referring now to FIG. 1, an illustrative computing device 100 for network programming includes a processor 120 and a field-programmable gate array (FPGA) 130. In use, as described below, the computing device 100 analyzes a source program that includes a network application written in a domain-specific, declarative language such as P4. The computing device 100 translates the declarative program into a register transfer level (RTL) description of the application for the FPGA 130. The computing device 100 compiles the RTL description into a bitstream for the FGPA 130 and then may program the FPGA 130 with the bitstream. The computing device 100 may optimize the RTL description during compilation, which may produce an optimized bitstream with reduced resource usage and/or improved performance. Thus, the computing device 100 may allow for network application development using a flexible, high-productivity declarative language such as P4, while still allowing the application to be run efficiently on FPGA hardware. Accordingly, the computing device 100 may perform network packet processing using the FPGA 130 with improved clock speeds and/or reduced physical resource usage. Additionally or alternatively, although illustrated as including an FPGA 130, it should be understood that in some embodiments the computing device 100 may translate and compile the source program into a bitstream targeted to an FPGA 130 for a different computing device 100.

The processor 120 may be embodied as any type of processor capable of performing the functions described herein. For example, the processor 120 may be embodied as a single or multi-core processor(s), digital signal processor, microcontroller, or other processor or processing/controlling circuit. Similarly, the memory 124 may be embodied as any type of volatile or non-volatile memory or data storage capable of performing the functions described herein. In operation, the memory 124 may store various data and software used during operation of the computing device 100 such operating systems, applications, programs, libraries, and drivers. The memory 124 is communicatively coupled to the processor 120 via the I/O subsystem 122, which may be embodied as circuitry and/or components to facilitate input/output operations with the processor 120, the memory 124, and other components of the computing device 100. For example, the I/O subsystem 122 may be embodied as, or otherwise include, memory controller hubs, input/output control hubs, sensor hubs, firmware devices, communication links (i.e., point-to-point links, bus links, wires, cables, light guides, printed circuit board traces, etc.) and/or other components and subsystems to facilitate the input/output operations. In some embodiments, the I/O subsystem 122 may form a portion of a system-on-a-chip (SoC) and be incorporated, along with the processor 120, the memory 124, and other components of the computing device 100, on a single integrated circuit chip.

The data storage device 126 may be embodied as any type of device or devices configured for short-term or long-term storage of data such as, for example, memory devices and circuits, memory cards, hard disk drives, solid-state drives, non-volatile flash memory, or other data storage devices. The computing device 100 may also include a communications subsystem 128, which may be embodied as any communication circuit, device, or collection thereof, capable of enabling communications between the computing device 100 and other remote devices over a computer network (not shown). For example, the communications subsystem 128 may be embodied as or otherwise include a network interface controller (NIC) for sending and/or receiving network data with remote devices. The communications subsystem 128 may be configured to use any one or more communication technology (e.g., wired or wireless communications) and associated protocols (e.g., Ethernet, InfiniBand®, Bluetooth®, Wi-Fi®, WiMAX, 3G, 4G LTE, etc.) to effect such communication.

As shown in FIG. 1, the computing device 100 includes a field-programmable gate array (FPGA) 130. The FPGA 130 may be embodied as an integrated circuit including programmable digital logic resources that may be configured after manufacture. The FPGA 130 may include, for example, a configurable array of logic blocks in communication over a configurable data interchange. The FPGA 130 may be coupled to the processor 120 via a high-speed connection interface such as a peripheral bus (e.g., a PCI Express bus) or an inter-processor interconnect (e.g., an in-die interconnect (IDI) or QuickPath Interconnect (QPI)), via a fabric interconnect such as Intel® Omni-Path Architecture, or via any other appropriate interconnect. Additionally, although illustrated in FIG. 1 as a discrete component separate from the processor 120 and/or the I/O subsystem 122, it should be understood that in some embodiments the FPGA 130, the processor 120, the I/O subsystem 122, and/or the memory 124 may be incorporated in the same package and/or in the same computer chip, for example in the same SoC. In some embodiments, the FPGA 130 may be incorporated as part of a network interface controller (NIC) of the computing device 100 and/or included in the same multi-chip package as the NIC. In some embodiments, the FPGA 130 may be integrated with the NIC on the same die (e.g., SoC).

The computing device 100 may further include one or more peripheral devices 132. The peripheral devices 132 may include any number of additional input/output devices, interface devices, and/or other peripheral devices. For example, in some embodiments, the peripheral devices 132 may include a touch screen, graphics circuitry, a graphical processing unit (GPU) and/or processor graphics, an audio device, a microphone, a camera, a keyboard, a mouse, a network interface, and/or other input/output devices, interface devices, and/or peripheral devices.

Figure 2:
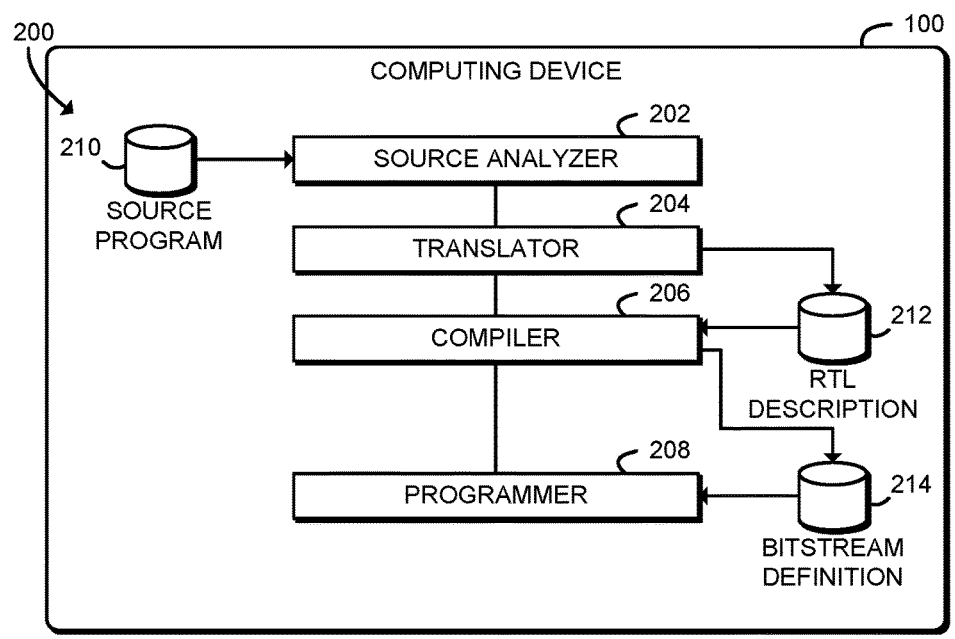
FIG. 2 is a simplified block diagram of at least one embodiment of an environment of the computing device of FIG. 1.

Referring now to FIG. 2, in an illustrative embodiment, the computing device 100 establishes an environment 200 during operation. The illustrative environment 200 includes source analyzer 202, a translator 204, a compiler 206, and a programmer 208. The various components of the environment 200 may be embodied as hardware, firmware, software, or a combination thereof. As such, in some embodiments, one or more of the components of the environment 200 may be embodied as circuitry or collection of electrical devices (e.g., source analyzer circuitry 202, translator circuitry 204, compiler circuitry 206, and/or programmer circuitry 208). It should be appreciated that, in such embodiments, one or more of the source analyzer circuitry 202, the translator circuitry 204, the compiler circuitry 206, and/or the programmer circuitry 208 may form a portion of the processor 120, the I/O subsystem 122, and/or other components of the computing device 100. Additionally, in some embodiments, one or more of the illustrative components may form a portion of another component and/or one or more of the illustrative components may be independent of one another.

The source analyzer 202 is configured to analyze a network application source program 210. The network application source program 210 may be embodied as a source code file or other computer program that includes a declarative description of a network application in a domain-specific language, such as the P4 language. Analyzing the network application source program 210 may include generating a parse graph including multiple nodes, determining a control flow that is indicative of an order of match-action tables, and/or analyzing definitions of the match-action tables.

The translator 204 is configured to translate the declarative description of the network application into a register-transfer level (RTL) description 212 of the network application. The RTL description 212 may be embodied as any computer file or other data that includes a RTL description of the network application. For example, the RTL description 212 may include a description of the network application in a RTL hardware description language such as Verilog or VHDL. Translating the declarative description may include generating multiple TCAM-SRAM structures, with each TCAM-SRAM structure corresponding to a node of the parse graph. Translating the declarative description may also include generating multiplexer logic and/or congestion management logic based on the control flow. Translating the declarative description may also include generating one or more lookup blocks to access the match-action tables in a memory external to the FPGA 130 (e.g., DRAM). Translating the declarative description may include generating a modify block to apply one or more actions from the match-action table to a network packet.

The compiler 206 is configured to compile the RTL description 212 of the network application into a bitstream definition 214 of the network application. The bitstream definition 214 is targeted to the FPGA 130. Compiling the RTL description 212 of the network application into the bitstream definition 214 may include optimizing the RTL description 212.

The programmer 208 is configured to program the FPGA 130 with the bitstream definition 214 in response to compilation. In some embodiments, the programmer 208 may be configured to partially reconfigure the FPGA 130 with the bitstream definition 214. Additionally or alternatively, in some embodiments partially reconfiguring the FPGA 130 may include programming a backup block of the FPGA 130 with the bitstream definition 214. In those embodiments, the programmer 208 may be configured to switch from an active block of the FPGA 130 to the backup block in response to the partial reconfiguration.

Figure 3:
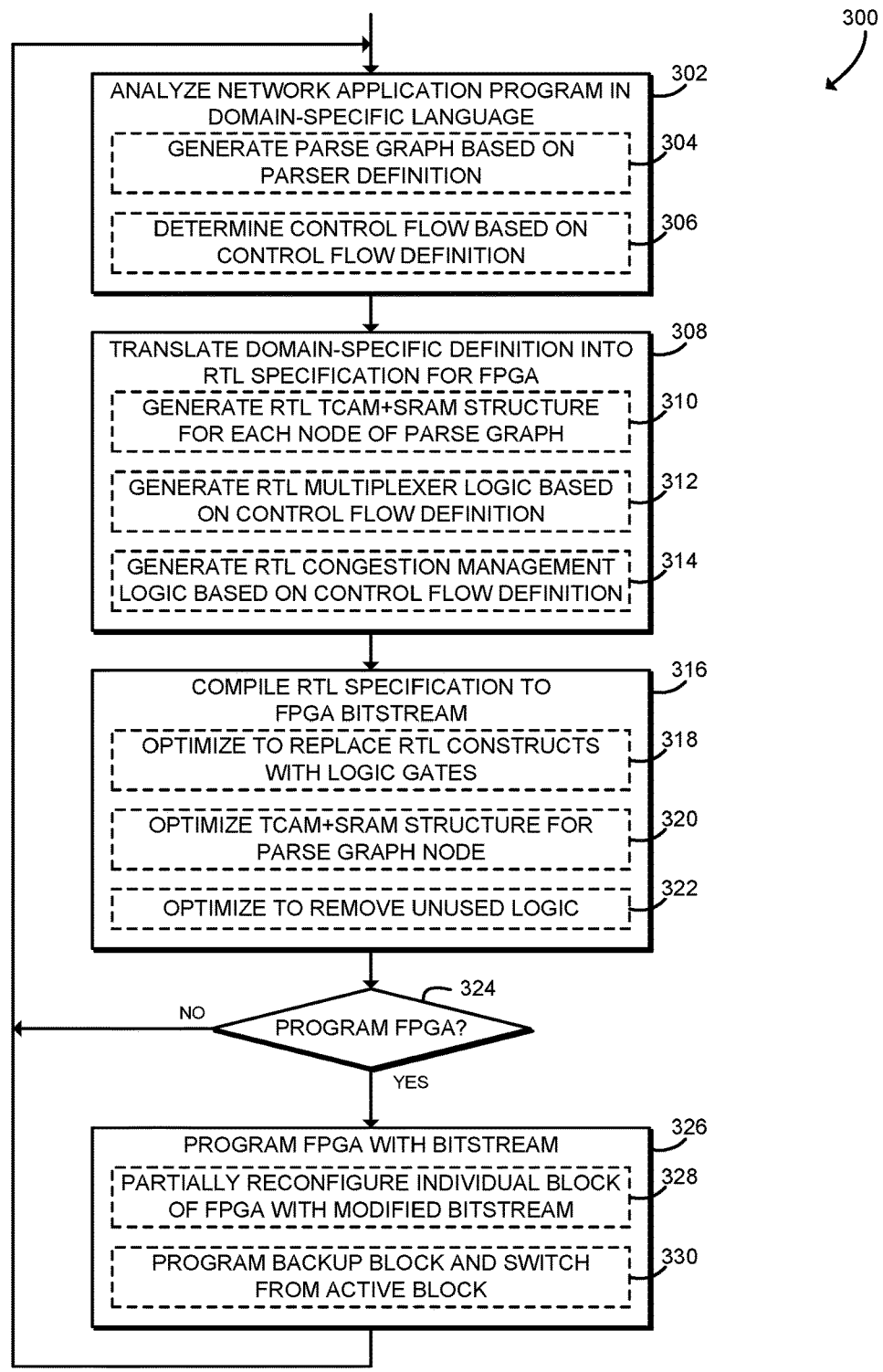
FIG. 3 is a simplified flow diagram of at least one embodiment of a method for network programming that may be executed by the computing device of FIGS. 1 and 2.

Referring now to FIG. 3, in use, the computing device 100 may execute a method 300 for network application programming with the FPGA 130. It should be appreciated that, in some embodiments, the operations of the method 300 may be performed by one or more components of the environment 200 of the computing device 100 as shown in FIG. 2. The method 300 begins in block 302, in which the computing device 100 analyzes a network application program written in domain-specific language. For example, the network application may be defined by a source program 210 that includes a P4 program. The network application may define a packet processing pipeline. For example, in some embodiments, the network application may implement an exact match cache (EMC) that may be used to offload packet processing tasks for an Open vSwitch programmable virtual switch. In some embodiments, in block 304 the computing device 100 may generate a parse graph based on a parser definition of the source program 210. The parser definition identifies one or more fields (e.g., header, data, or other fields) that are to be extracted from an incoming packet. In some embodiments, in block 306, the computing device 100 may determine control flow based on a control flow definition of the source program. The control flow determines which match-action tables are looked up and in what order.

In block 308, the computing device 100 translates the domain-specific application definition into a register-transfer level (RTL) description 212 for the FPGA 130. In some embodiments, in block 310, the computing device 100 may generate an RTL TCAM+SRAM structure for each node of the parse graph. In some embodiments, in block 312, the computing device 100 may generate RTL multiplexer logic based on the control flow definition. The multiplexer logic may concatenate multiple fields identified by the parser into a match key, which is used to look up an entry in a match-action table. The control flow multiplexer logic also defines what actions are taken if a match-action table misses, and how the results are interpreted if there is a hit. In some embodiments, in block 314, the computing device 100 may generate RTL congestion management logic based on the control flow definition. The congestion management logic may be generated as state machine logic at the end of the packet processing pipeline, for example comparing a set of watermarks against the current utilization of packet memory.

Figure 4:
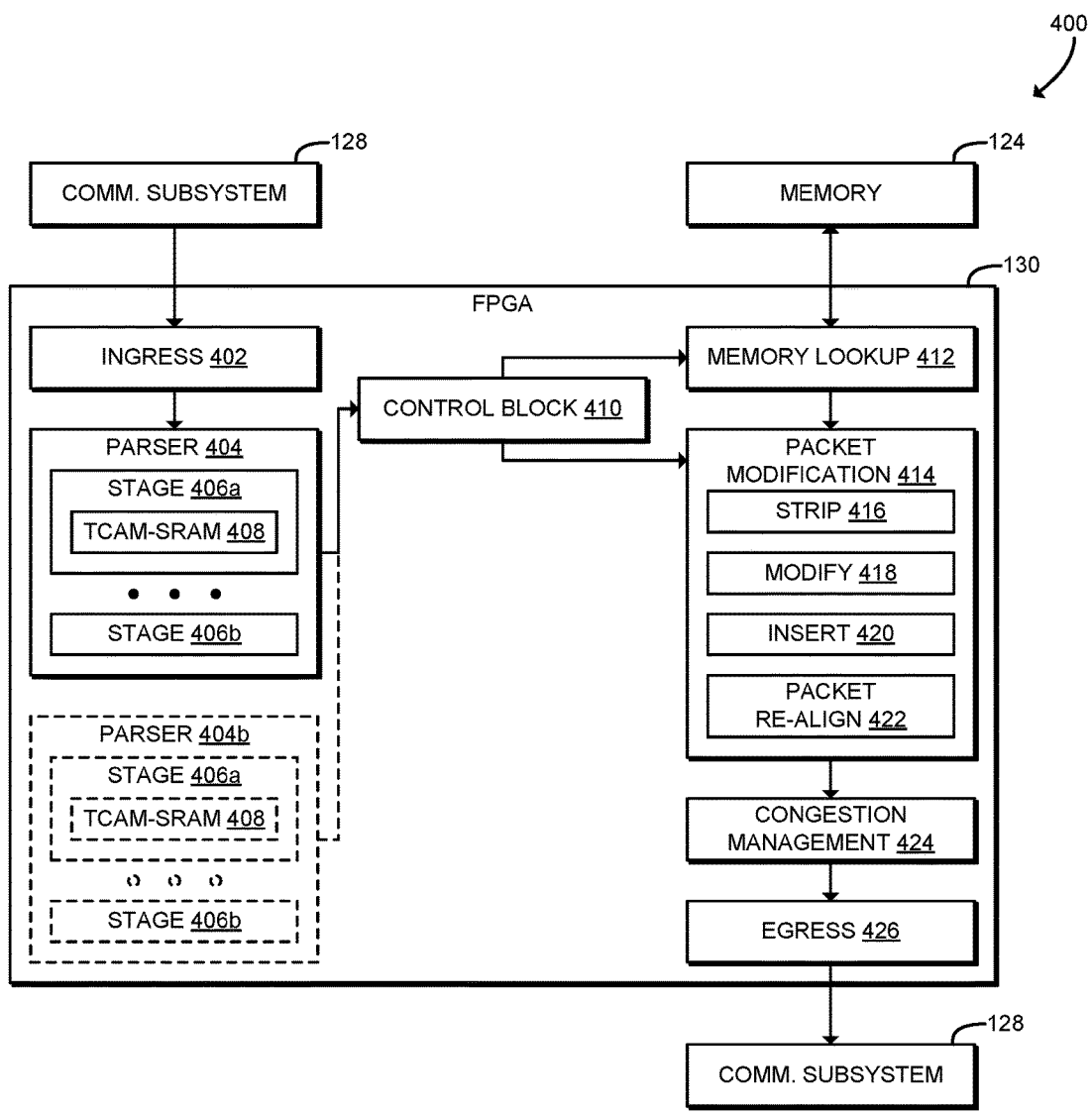
FIG. 4 is a simplified schematic diagram of at least one embodiment of an RTL FPGA application that may be generated by the computing device of FIGS. 1-2.

Referring now to FIG. 4, diagram 400 illustrates one potential embodiment of an RTL description 212 that may be generated by the computing device 100. As described above, the RTL description 212 may be generated by the computing device 100 based on a source program in a domain-specific declarative programming language such as P4. As shown, the RTL description 212 may include an ingress block 402, a parser 404, a control block 410, a memory lookup block 412, a packet modification block 414, a congestion management block 424, and an egress block 426. Those components may operate as a fixed-function packet processing pipeline, based on the P4 definition of the network application program.

The ingress block 402 receives network packets from the communication subsystem 128. For example, the ingress block 402 may receive network packets from one or more MACs or other network port logic. Incoming network packet data may be placed on a ring, bus, or otherwise communicated to other blocks of the FPGA 130, such as the parser 404.

The parser 404 parses an incoming packet to identify one or more headers within the packet. The parser may receive packet data from the ingress block 402 in an interleaved manner. After parsing, the parser 404 may forward packet data, lookup results, and other packet information (such as first and last cell address) to packet memory. As shown, the parser 404 may include multiple stages 406, which each correspond to a node of the parse graph. Thus, the number of stages 406 may be determined from the deepest parsing graph inferred from the source program 210.

Each stage 406 includes a TCAM-SRAM block 408. The maximum number fields that will be looked at in parallel will be inferred based on the source program 210. During the parsing of the packet, a header offset, header type, and field offsets may be maintained. The header type indicates which type of header is being currently parsed, the header offset points to the start of this header in the packet, and field offsets relative to the header offset point to the fields that should be extracted for lookup. The header type and packet data from those field offsets may be used to form a TCAM lookup key. This lookup key will be matched against the static entries for that particular stage 406. The matching corresponding SRAM entry indicates how all the fields representing the state should be updated. In addition to updating the state, the parsing stage 406 will also populate the lookup fields specified in the source program 210. The SRAM also contains an entry to indicate when parsing should be ended. The parser 404 drives the lookup results to the control block 410 when the end of packet (EOP) for the packet is received. Parsing results may be transferred, for example, using a buffer of packet lookup descriptor entries.

The control block 410 determines which match-action tables are looked up and in what order. The control block 410 implements the control flow defined by the source program 210. As described above, the control block 410 includes multiplexer logic to concatenate multiple fields identified by the parser 404 into a match key. The match key is provided to the memory lookup block 412 to look up an entry in a match-action table. The control block 410 multiplexer logic also defines what actions are taken if a match-action table misses, and how the results are interpreted if there is a hit. At the end of the control flow, results from the table lookups (i.e., modification requests) are queued up and sent to the packet modification block 414.

The memory lookup block 412 accesses external memory (e.g., DDR memory) that contains the match-action tables. For example, the memory lookup block 412 may lookup match-action tables in the main memory 124 or in a DDR memory coupled to the FPGA 130. The memory lookup block 412 may receive a lookup key (e.g., a concatenation of various packet header fields) from the control block 410, and then look up an entry matching the lookup key in the match-action table. The key definition, result definition, and the number of times the memory is accessed is defined in the control flow of the source program 210. For each match, the memory lookup block 412 retrieves a set of bytes that are interpreted by the fixed-function pipeline of the FPGA 130. Every entry in the match-action table may be counted (e.g., both the number of packets hitting the entry and the number of bytes hitting the entry). This allows the network application to determine the size of the lookup performed, which is directly related to the number of packets/second that are supported by the pipeline. The match-action tables may be populated by an administrator or by a software pipeline, for example by an Open vSwitch (OVS) control plane. For example, an OVS software pipeline may translate one or more rules into match-action table entries on the first packet of every new flow, and then install those entries into the appropriate match-action table. The memory lookup block 412 may return one or more commands, such as packet modification commands, to be performed from the match-action tables. The commands may be transferred to the packet modification block 414 using a buffer of packet transmit descriptors.

The packet modification block 414 performs actions that were specified by the match-action tables. The packet modification block 414 performs any header modification before sending the packet to the destination port. The packet modification block 414 receives the packet data from the pipeline and the modification commands from the control flow. The packet modification block 414 may be capable of performing any packet encapsulation, de-encapsulation, or modification that has been specified in the network application of the source program 210. At egress, the packet modification block 414 may maintain a per-port packet re-align block 422 that will re-align the packet data to 64 bytes before transferring the packet data on a ring or other internal data interconnect. The packet modification block 414 may also maintain a per-port context that contains the current state of the header, including partial checksums, number of bytes remaining in packet, total incoming packet length, first segment address, last segment address, and/or other state information. The checksum may be a domain specific function to correctly calculate IP and L4 checksums in each header. The packet modification block 414 may be capable of supporting packet segmentation. The incoming packet may contain a segmentation enable and max length of each segment. The control block 410 may still schedule the packet to packet modify as a single packet; however, the packet modification block 414 may chop the packet into smaller packets. The headers that need to be added for every segment will be stored when the first packet is received. The control block 410 may also schedule the packet to packet modify with a list of pointers, where each pointer points to a fragment of the packet. The fragments in this list may be concatenated back together before the other modification operations are applied.

The packet modification block 414 may include one or more sub-blocks to perform the requested commands, such as a strip block 416, a modify block 418, and/or an insert block 420. The packet modification block 414 may receive the starting offset for each header from the parser 404. Header strip commands may be received in the form of an n-bit vector. The value of n may be inferred from the source program 210. Each bit in the vector represents each valid header in the packet. The strip block 416 may remove any header with a corresponding bit that has a value of 0. Packet modify commands may be in the format {header number, field offset, field length, source of new value}. The header number indicates which header the command is applicable to, starting from number 0 at the MSB of the packet. For example, a packet with Ethernet, VLAN, IPv4, and TCP will have header 0 for Ethernet, header 1 for VLAN, header 2 for IPv4, and header 3 for TCP. The source field may represent either a static value, a value contained in a packet transmit descriptor (received from the memory lookup block 412), an index into a memory, or an offset into the current packet. Insert commands may be in the format {header number, source of header}. The header number indicates where the header should be inserted. The source of the header may be a memory.

The congestion management block 424 may perform congestion management operations, including dropping and/or delaying transmission of the packet after packet modifications are completed. The congestion management block 424 may be generated based on one or more control flow definitions of the source program 210. The congestion management block 424 is emitted as state machine logic at the end of the pipeline. Congestion management involving comparing set of watermarks against the current utilization of the packet memory. The congestion management may flow control or drop the packet if the packet buffer is congested.

The egress block 426 outputs the packet to an appropriate port of the communication subsystem 128. The egress block 426 may, for example, pull packets after modification from a packet memory and then output them to the appropriate port of the communication subsystem 128.

Referring back to FIG. 3, after generating the RTL description 212, in block 316 the computing device 100 compiles the RTL description 212 into the bitstream definition 214 for the FPGA 130. The computing device 100 may use an RTL toolchain to synthesize, place and route, optimize, and otherwise compile the RTL description 212 into the bitstream definition 214. Optimizing the RTL description 212 may improve the space, time, power, or other efficiency of the generated bitstream definition 214, but may not necessarily generate the mathematically optimal or otherwise most efficient bitstream definition 214 possible. Thus, after compilation and optimization, the bitstream definition 214 may include a reduced (or minimal) amount of logic gates or other resources required to perform the network program. In some embodiments, in block 318, the computing device 100 may optimize the bitstream definition 214 by replacing RTL constructs with logic gates. In some embodiments, in block 320, the computing device 100 may optimize the bitstream definition 214 by replacing the TCAM+SRAM structure for each parse graph node with equivalent logic gates. Because most rules in a P4 source program 210 do not require the "ternary" match of the TCAM, most parser rules may be optimized into simple "if-then" state machine comparisons by the RTL compiler. This optimization may allow only the required parsing logic to be put into a fixed function pipeline in the FPGA 130, removing all of the unused gates and logic. In some embodiments, in block 322, the computing device 100 may optimize the bitstream definition 214 by removing remaining unused logic.

In block 324, the computing device 100 determines whether to program the FPGA 130 with the bitstream definition 214. For example, a production computing device 100 may program the FPGA 130 in order to perform packet processing tasks. In particular, the FPGA 130 may be programmed to operate as an exact match cache (EMC) used with an Open vSwitch (OVS) software pipeline. After programming, the FPGA 130 could then be paired with a software control plane to have forwarding rules populated in the same fashion that an all-software pipeline would be populated. The FPGA 130 may fully mimic the behavior of the software pipeline it offloads. Of course, it should be understood that in some embodiments the bitstream definition 214 may be used to program a different computing device 100. If the computing device 100 determines not to program the FPGA 130, the method 300 loops back to block 302, in which the computing device 100 may analyze and compile another source program 210 (e.g., a different network application program, a new version of the application program, or other source program 210). If the computing device 100 determines to program the FPGA 130, the method 300 advances to block 326.

In block 326 the computing device 100 programs the FPGA 130 with the bitstream definition 214. The computing device 100 may use any appropriate technique to program or otherwise configure the logic blocks or other digital logic resources of the FPGA 130 with the bitstream definition 214. In some embodiments, in block 328, the computing device 100 may partially reconfigure an individual block of the FPGA 130 with a modified bitstream definition 214. For example, the computing device 100 may partially reconfigure only parts of the bitstream definition 214 that have changed between versions of the source program 210. In some embodiments, in block 330, the computing device 100 may program a backup block of the FPGA 130 and switch from an active block to the newly programmed backup block. In those embodiments, parts of the FPGA 130 may be reserved for backup blocks (e.g., a backup parser, a backup control block, etc.). The computing device 100 may program and switch to the backup blocks in order to support online reconfiguration. For example, referring again to FIG. 4, the illustrative FPGA 130 includes resources reserved for a backup parser 404*b*. In that example, the backup parser 404*b* may be reconfigured with a revised bitstream definition 214, and then the control block 410 may switch from the original parser 404 to the newly-programmed parser 404*b*, allowing for fast reconfiguration. Referring back to FIG. 3, after programming the FPGA 130, the method 300 loops back to block 302, in which the computing device 100 may analyze and compile another source program 210 (e.g., a different network application program, a new version of the application program, or other source program 210).

It should be appreciated that, in some embodiments, the method 300 may be embodied as various instructions stored on a computer-readable media, which may be executed by the processor 120, the FPGA 130, and/or other components of the computing device 100 to cause the computing device 100 to perform the method 300. The computer-readable media may be embodied as any type of media capable of being read by the computing device 100 including, but not limited to, the memory 124, the data storage device 126, firmware devices, other memory or data storage devices of the computing device 100, portable media readable by a peripheral device 132 of the computing device 100, and/or other media.

EXAMPLES

Illustrative examples of the technologies disclosed herein are provided below. An embodiment of the technologies may include any one or more, and any combination of, the examples described below.

Example 1 includes a computing device for network application programming, the computing device comprising: one or more processors; and one or more memory devices having stored therein a plurality of instructions that, when executed by the one or more processors, cause the computing device to: analyze a network application source program, wherein the network application source program comprises a declarative description of a network application in a domain-specific language; translate the declarative description of the network application into a register-transfer level description of the network application; and compile the register-transfer level description of the network application into a bitstream definition of the network application, wherein the bitstream is targeted to a field-programmable gate array.

Example 2 includes the subject matter of Example 1, and wherein the plurality of instructions, when executed, further cause the computing device to program the field-programmable gate array with the bitstream definition in response to compilation of the register-transfer level description.

Example 3 includes the subject matter of any of Examples 1 and 2, and wherein the plurality of instructions, when executed, further cause the computing device to partially reconfigure the field-programmable gate array with the bitstream definition in response to compilation of the register-transfer level description.

Example 4 includes the subject matter of any of Examples 1-3, and wherein: the plurality of instructions, when executed, further cause the computing device to switch from an active block of the field-programmable gate array to a backup block of the field-programmable gate array in response to partial reconfiguration of the field-programmable gate array; and to partially reconfigure the field-programmable gate array comprises to program the backup block with the bitstream definition.

Example 5 includes the subject matter of any of Examples 1-4, and wherein to compile the register-transfer level description of the network application into a bitstream definition comprises to optimize the register-transfer level description of the network application.

Example 6 includes the subject matter of any of Examples 1-5, and wherein: to analyze the network application source program comprises to generate a parse graph based on the network application source program, wherein the parse graph comprises a plurality of nodes; and to translate the declarative description of the network application into the register-transfer level description of the network application comprises to generate a plurality of TCAM-SRAM structures, wherein each TCAM-SRAM structure corresponds to a node of the parse graph.

Example 7 includes the subject matter of any of Examples 1-6, and wherein to compile the register-transfer level description of the network application into the bitstream definition comprises to optimize the plurality of TCAM-SRAM structures to generate corresponding logic gates.

Example 8 includes the subject matter of any of Examples 1-7, and wherein: to analyze the network application source program comprises to determine a control flow of the network application, wherein the control flow is indicative of an order of match-action tables; and to translate the declarative description of the network application into the register-transfer level description of the network application comprises to generate multiplexer logic based on the control flow.

Example 9 includes the subject matter of any of Examples 1-8, and wherein: to analyze the network application source program comprises to determine a control flow of the network application, wherein the control flow is indicative of an order of match-action tables; and to translate the declarative description of the network application into the register-transfer level description of the network application comprises to generate congestion management logic based on the control flow.

Example 10 includes the subject matter of any of Examples 1-9, and wherein: to analyze the network application source program comprises to analyze a definition of a match-action table; and to translate the declarative description of the network application into the register-transfer level description of the network application comprises to generate a lookup block to access the match-action table in an external memory.

Example 11 includes the subject matter of any of Examples 1-10, and wherein to translate the declarative description of the network application into the register-transfer level description of the network application comprises to generate a modify block to apply one or more actions from the match-action table to a network packet.

Example 12 includes the subject matter of any of Examples 1-11, and wherein the computing device further comprises a network interface controller, and wherein the network interface controller comprises the field-programmable gate array.

Example 13 includes the subject matter of any of Examples 1-12, and wherein the computing device further comprises a multi-chip package, wherein the multi-chip package comprises a network interface controller and the field-programmable gate array.

Example 14 includes the subject matter of any of Examples 1-13, and wherein the computing device comprises a system-on-a-chip, wherein the system-on-a chip comprises the one or more processors, the field-programmable gate array, and a network interface controller.

Example 15 includes a method for network application programming, the method comprising: analyzing, by a computing device, a network application source program, wherein the network application source program comprises a declarative description of a network application in a domain-specific language; translating, by the computing device, the declarative description of the network application into a register-transfer level description of the network application; and compiling, by the computing device, the register-transfer level description of the network application into a bitstream definition of the network application, wherein the bitstream is targeted to a field-programmable gate array.

Example 16 includes the subject matter of Example 15, and further comprising: programming, by the computing device, the field-programmable gate array with the bitstream definition in response to compiling the register-transfer level description.

Example 17 includes the subject matter of any of Examples 15 and 16, and further comprising partially reconfiguring, by the computing device, the field-programmable gate array with the bitstream definition in response to compiling the register-transfer level description.

Example 18 includes the subject matter of any of Examples 15-17, and further comprising: switching, by the computing device, from an active block of the field-programmable gate array to a backup block of the field-programmable gate array in response to partially reconfiguring the field-programmable gate array; wherein partially reconfiguring the field-programmable gate array comprises programming the backup block with the bitstream definition.

Example 19 includes the subject matter of any of Examples 15-18, and wherein compiling the register-transfer level description of the network application into a bitstream definition comprises optimizing the register-transfer level description of the network application.

Example 20 includes the subject matter of any of Examples 15-19, and wherein: analyzing the network application source program comprises generating a parse graph based on the network application source program, wherein the parse graph comprises a plurality of nodes; and translating the declarative description of the network application into the register-transfer level description of the network application comprises generating a plurality of TCAM-SRAM structures, wherein each TCAM-SRAM structure corresponds to a node of the parse graph.

Example 21 includes the subject matter of any of Examples 15-20, and wherein compiling the register-transfer level description of the network application into the bitstream definition comprises optimizing the plurality of TCAM-SRAM structures to generate corresponding logic gates.

Example 22 includes the subject matter of any of Examples 15-21, and wherein: analyzing the network application source program comprises determining a control flow of the network application, wherein the control flow is indicative of an order of match-action tables; and translating the declarative description of the network application into the register-transfer level description of the network application comprises generating multiplexer logic based on the control flow.

Example 23 includes the subject matter of any of Examples 15-22, and wherein: analyzing the network application source program comprises determining a control flow of the network application, wherein the control flow is indicative of an order of match-action tables; and translating the declarative description of the network application into the register-transfer level description of the network application comprises generating congestion management logic based on the control flow.

Example 24 includes the subject matter of any of Examples 15-23, and wherein: analyzing the network application source program comprises analyzing a definition of a match-action table; and translating the declarative description of the network application into the register-transfer level description of the network application comprises generating a lookup block to access the match-action table in an external memory.

Example 25 includes the subject matter of any of Examples 15-24, and wherein translating the declarative description of the network application into the register-transfer level description of the network application comprises generating a modify block to apply one or more actions from the match-action table to a network packet.

Example 26 includes the subject matter of any of Examples 15-25, and wherein the computing device further comprises a network interface controller, and wherein the network interface controller comprises the field-programmable gate array.

Example 27 includes the subject matter of any of Examples 15-26, and wherein the computing device further comprises a multi-chip package, wherein the multi-chip package comprises a network interface controller and the field-programmable gate array.

Example 28 includes the subject matter of any of Examples 15-27, and wherein the computing device comprises a system-on-a-chip, wherein the system-on-a chip comprises the one or more processors, the field-programmable gate array, and a network interface controller.

Example 29 includes a computing device comprising: a processor; and a memory having stored therein a plurality of instructions that when executed by the processor cause the computing device to perform the method of any of Examples 15-28.

Example 30 includes one or more machine readable storage media comprising a plurality of instructions stored thereon that in response to being executed result in a computing device performing the method of any of Examples 15-28.

Example 31 includes a computing device comprising means for performing the method of any of Examples 15-28.

Example 32 includes a computing device for network application programming, the computing device comprising: source analyzer circuitry to analyze a network application source program, wherein the network application source program comprises a declarative description of a network application in a domain-specific language; translator circuitry to translate the declarative description of the network application into a register-transfer level description of the network application; and compiler circuitry to compile the register-transfer level description of the network application into a bitstream definition of the network application, wherein the bitstream is targeted to a field-programmable gate array.

Example 33 includes the subject matter of Example 32, and further comprising programmer circuitry to program the field-programmable gate array with the bitstream definition in response to compilation of the register-transfer level description.

Example 34 includes the subject matter of any of Examples 32 and 33, and further comprising programmer circuitry to partially reconfigure the field-programmable gate array with the bitstream definition in response to compilation of the register-transfer level description.

Example 35 includes the subject matter of any of Examples 32-34, and further comprising: programmer circuitry to switch from an active block of the field-programmable gate array to a backup block of the field-programmable gate array in response to partial reconfiguration of the field-programmable gate array; wherein to partially reconfigure the field-programmable gate array comprises to program the backup block with the bitstream definition.

Example 36 includes the subject matter of any of Examples 32-35, and wherein to compile the register-transfer level description of the network application into a bitstream definition comprises to optimize the register-transfer level description of the network application.

Example 37 includes the subject matter of any of Examples 32-36, and wherein: to analyze the network application source program comprises to generate a parse graph based on the network application source program, wherein the parse graph comprises a plurality of nodes; and to translate the declarative description of the network application into the register-transfer level description of the network application comprises to generate a plurality of TCAM-SRAM structures, wherein each TCAM-SRAM structure corresponds to a node of the parse graph.

Example 38 includes the subject matter of any of Examples 32-37, and wherein to compile the register-transfer level description of the network application into the bitstream definition comprises to optimize the plurality of TCAM-SRAM structures to generate corresponding logic gates.

Example 39 includes the subject matter of any of Examples 32-38, and wherein: to analyze the network application source program comprises to determine a control flow of the network application, wherein the control flow is indicative of an order of match-action tables; and to translate the declarative description of the network application into the register-transfer level description of the network application comprises to generate multiplexer logic based on the control flow.

Example 40 includes the subject matter of any of Examples 32-39, and wherein: to analyze the network application source program comprises to determine a control flow of the network application, wherein the control flow is indicative of an order of match-action tables; and to translate the declarative description of the network application into the register-transfer level description of the network application comprises to generate congestion management logic based on the control flow.

Example 41 includes the subject matter of any of Examples 32-40, and wherein: to analyze the network application source program comprises to analyze a definition of a match-action table; and to translate the declarative description of the network application into the register-transfer level description of the network application comprises to generate a lookup block to access the match-action table in an external memory.

Example 42 includes the subject matter of any of Examples 32-41, and wherein to translate the declarative description of the network application into the register-transfer level description of the network application comprises to generate a modify block to apply one or more actions from the match-action table to a network packet.

Example 43 includes the subject matter of any of Examples 32-42, and wherein the computing device further comprises a network interface controller, and wherein the network interface controller comprises the field-programmable gate array.

Example 44 includes the subject matter of any of Examples 32-43, and wherein the computing device further comprises a multi-chip package, wherein the multi-chip package comprises a network interface controller and the field-programmable gate array.

Example 45 includes the subject matter of any of Examples 32-44, and wherein the computing device comprises a system-on-a-chip, wherein the system-on-a chip comprises the one or more processors, the field-programmable gate array, and a network interface controller.

Example 46 includes a computing device for network application programming, the computing device comprising: means for analyzing a network application source program, wherein the network application source program comprises a declarative description of a network application in a domain-specific language; means for translating the declarative description of the network application into a register-transfer level description of the network application; and means for compiling the register-transfer level description of the network application into a bitstream definition of the network application, wherein the bitstream is targeted to a field-programmable gate array.

Example 47 includes the subject matter of Example 46, and further comprising: means for programming the field-programmable gate array with the bitstream definition in response to compiling the register-transfer level description.

Example 48 includes the subject matter of any of Examples 46 and 47, and further comprising partially reconfiguring the field-programmable gate array with the bitstream definition in response to compiling the register-transfer level description.

Example 49 includes the subject matter of any of Examples 46-48, and further comprising: means for switching from an active block of the field-programmable gate array to a backup block of the field-programmable gate array in response to partially reconfiguring the field-programmable gate array; wherein the means for partially reconfiguring the field-programmable gate array comprises means for programming the backup block with the bitstream definition.

Example 50 includes the subject matter of any of Examples 46-49, and wherein the means for compiling the register-transfer level description of the network application into a bitstream definition comprises means for optimizing the register-transfer level description of the network application.

Example 51 includes the subject matter of any of Examples 46-50, and wherein: the means for analyzing the network application source program comprises means for generating a parse graph based on the network application source program, wherein the parse graph comprises a plurality of nodes; and the means for translating the declarative description of the network application into the register-transfer level description of the network application comprises means for generating a plurality of TCAM-SRAM structures, wherein each TCAM-SRAM structure corresponds to a node of the parse graph.

Example 52 includes the subject matter of any of Examples 46-51, and wherein the means for compiling the register-transfer level description of the network application into the bitstream definition comprises means for optimizing the plurality of TCAM-SRAM structures to generate corresponding logic gates.

Example 53 includes the subject matter of any of Examples 46-52, and wherein: the means for analyzing the network application source program comprises means for determining a control flow of the network application, wherein the control flow is indicative of an order of match-action tables; and the means for translating the declarative description of the network application into the register-transfer level description of the network application comprises means for generating multiplexer logic based on the control flow.

Example 54 includes the subject matter of any of Examples 46-53, and wherein: the means for analyzing the network application source program comprises means for determining a control flow of the network application, wherein the control flow is indicative of an order of match-action tables; and the means for translating the declarative description of the network application into the register-transfer level description of the network application comprises means for generating congestion management logic based on the control flow.

Example 55 includes the subject matter of any of Examples 46-54, and wherein: the means for analyzing the network application source program comprises means for analyzing a definition of a match-action table; and the means for translating the declarative description of the network application into the register-transfer level description of the network application comprises means for generating a lookup block to access the match-action table in an external memory.

Example 56 includes the subject matter of any of Examples 46-55, and wherein the means for translating the declarative description of the network application into the register-transfer level description of the network application comprises means for generating a modify block to apply one or more actions from the match-action table to a network packet.

Example 57 includes the subject matter of any of Examples 46-56, and wherein the computing device further comprises a network interface controller, and wherein the network interface controller comprises the field-programmable gate array.

Example 58 includes the subject matter of any of Examples 46-57, and wherein the computing device further comprises a multi-chip package, wherein the multi-chip package comprises a network interface controller and the field-programmable gate array.

Example 59 includes the subject matter of any of Examples 46-58, and wherein the computing device comprises a system-on-a-chip, wherein the system-on-a chip comprises the one or more processors, the field-programmable gate array, and a network interface controller.

The invention claimed is:

1. A computing device for network application programming, the computing device comprising:
one or more processors; and
one or more memory devices having stored therein a plurality of instructions that, when executed by the one or more processors, cause the computing device to:
analyze a network application source program, wherein the network application source program comprises a declarative description of a network application in a domain-specific language, wherein to analyze the network application source program comprises to generate a parse graph that includes a plurality of nodes based on the network application source program;
translate the declarative description of the network application into a register-transfer level description of the network application, wherein to translate the declarative description of the network application into the register-transfer level description of the network application comprises to generate a plurality of TCAM-SRAM structures, wherein each TCAM-SRAM structure corresponds to a node of the parse graph; and
compile the register-transfer level description of the network application into a bitstream definition of the network application, wherein the bitstream is targeted to a field-programmable gate array, wherein to compile the register-transfer level description of the network application into the bitstream definition comprises to optimize a first TCAM-SRAM structure of the plurality of TCAM-SRAM structures by replacing the first TCAM-SRAM structure with a state machine comparison logic.

2. The computing device of claim 1, wherein the plurality of instructions, when executed, further cause the computing device to program the field-programmable gate array with the bitstream definition in response to compilation of the register-transfer level description.

3. The computing device of claim 1, wherein the plurality of instructions, when executed, further cause the computing device to partially reconfigure the field-programmable gate array with the bitstream definition in response to compilation of the register-transfer level description.

4. The computing device of claim 3, wherein:
the plurality of instructions, when executed, further cause the computing device to switch from an active block of the field-programmable gate array to a backup block of the field-programmable gate array in response to partial reconfiguration of the field-programmable gate array; and
to partially reconfigure the field-programmable gate array comprises to program the backup block with the bitstream definition.

5. The computing device of claim 1, wherein to compile the register-transfer level description of the network application into a bitstream definition comprises to optimize the register-transfer level description of the network application.

6. The computing device of claim 1, wherein to compile the register-transfer level description of the network application into the bitstream definition comprises to optimize the plurality of TCAM-SRAM structures to generate corresponding logic gates.

7. The computing device of claim 1, wherein:
to analyze the network application source program comprises to determine a control flow of the network application, wherein the control flow is indicative of an order of match-action tables; and
to translate the declarative description of the network application into the register-transfer level description of the network application comprises to generate multiplexer logic based on the control flow.

8. The computing device of claim 1, wherein:
to analyze the network application source program comprises to determine a control flow of the network application, wherein the control flow is indicative of an order of match-action tables; and
to translate the declarative description of the network application into the register-transfer level description of the network application comprises to generate congestion management logic based on the control flow.

9. The computing device of claim 1, wherein:
to analyze the network application source program comprises to analyze a definition of a match-action table; and
to translate the declarative description of the network application into the register-transfer level description of the network application comprises to generate a lookup block to access the match-action table in an external memory.

10. The computing device of claim 9, wherein to translate the declarative description of the network application into the register-transfer level description of the network application comprises to generate a modify block to apply one or more actions from the match-action table to a network packet.

11. The computing device of claim 1, wherein the computing device further comprises a network interface controller, and wherein the network interface controller comprises the field-programmable gate array.

12. One or more non-transitory, machine-readable storage media comprising a plurality of instructions stored thereon that, in response to being executed, cause a computing device to:
analyze a network application source program, wherein the network application source program comprises a declarative description of a network application in a domain-specific language, wherein to analyze the network application source program comprises to generate a parse graph that includes a plurality of nodes based on the network application source program;
translate the declarative description of the network application into a register-transfer level description of the network application, wherein to translate the declarative description of the network application into the register-transfer level description of the network application comprises to generate a plurality of TCAM-SRAM structures, wherein each TCAM-SRAM structure corresponds to a node of the parse graph; and
compile the register-transfer level description of the network application into a bitstream definition of the network application, wherein the bitstream is targeted to a field-programmable gate array, wherein to compile the register-transfer level description of the network application into the bitstream definition comprises to optimize a first TCAM-SRAM structure of the plurality of TCAM-SRAM structures by replacing the first TCAM-SRAM structure with a state machine comparison logic.

13. The one or more non-transitory, machine-readable storage media of claim 12, wherein the plurality of instructions, when executed, further cause the computing device to program the field-programmable gate array with the bitstream definition in response to compiling the register-transfer level description.

14. The one or more non-transitory, machine-readable storage media of claim 12, wherein the plurality of instructions, when executed, further cause the computing device to partially reconfigure the field-programmable gate array with the bitstream definition in response to compiling the register-transfer level description.

15. The one or more non-transitory, machine-readable storage media of claim 14, wherein the plurality of instructions, when executed, further cause the computing device to:
switch from an active block of the field-programmable gate array to a backup block of the field-programmable gate array in response to partially reconfiguring the field-programmable gate array;
wherein to partially reconfigure the field-programmable gate array comprises to program the backup block with the bitstream definition.

16. The one or more non-transitory, machine-readable storage media of claim 12, wherein to compile the register-transfer level description of the network application into a bitstream definition comprises to optimize the register-transfer level description of the network application.

17. The one or more non-transitory, machine-readable storage media of claim 12, wherein to compile the register-transfer level description of the network application into the bitstream definition comprises to optimize the plurality of TCAM-SRAM structures to generate corresponding logic gates.

18. The one or more non-transitory, machine-readable storage media of claim 12, wherein:
to analyze the network application source program comprises to determine a control flow of the network application, wherein the control flow is indicative of an order of match-action tables; and
to translate the declarative description of the network application into the register-transfer level description of the network application comprises to generate multiplexer logic based on the control flow.

19. The one or more non-transitory, machine-readable storage media of claim 12, wherein:
to analyze the network application source program comprises to determine a control flow of the network application, wherein the control flow is indicative of an order of match-action tables; and
to translate the declarative description of the network application into the register-transfer level description of the network application comprises to generate congestion management logic based on the control flow.

20. The one or more non-transitory, machine-readable storage media of claim 12, wherein:
to analyze the network application source program comprises to analyze a definition of a match-action table; and
to translate the declarative description of the network application into the register-transfer level description of the network application comprises to generate a lookup block to access the match-action table in an external memory.

21. The one or more non-transitory, machine-readable storage media of claim 20, wherein to translate the declarative description of the network application into the register-transfer level description of the network application comprises to generate a modify block to apply one or more actions from the match-action table to a network packet.

22. A computing device for network application programming, the computing device comprising:

means for analyzing a network application source program, wherein the network application source program comprises a declarative description of a network application in a domain-specific language, wherein the means for analyzing the network application source program comprises means for generating a parse graph that includes a plurality of nodes based on the network application source program;

means for translating the declarative description of the network application into a register-transfer level description of the network application, wherein the means for translating the declarative description of the network application into the register-transfer level description of the network application comprises means for generating a plurality of TCAM-SRAM structures, wherein each TCAM-SRAM structure corresponds to a node of the parse graph; and means for compiling the register-transfer level description of the network application into a bitstream definition of the network application, wherein the bitstream is targeted to a field-programmable gate array, wherein the means for compiling the register-transfer level description of the network application into the bitstream definition comprises means for optimizing a first TCAM-SRAM structure of the plurality of TCAM-SRAM structures by replacing the first TCAM-SRAM structure with a state machine comparison logic.

23. A method for network application programming, the method comprising:

analyzing, by a computing device, a network application source program, wherein the network application source program comprises a declarative description of a network application in a domain-specific language, wherein analyzing the network application source program comprises generating a parse graph that includes a plurality of nodes based on the network application source program;

translating, by the computing device, the declarative description of the network application into a register-transfer level description of the network application, wherein translating the declarative description of the network application into the register-transfer level description of the network application comprises generating a plurality of TCAM-SRAM structures, wherein each TCAM-SRAM structure corresponds to a node of the parse graph; and compiling, by the computing device, the register-transfer level description of the network application into a bitstream definition of the network application, wherein the bitstream is targeted to a field-programmable gate array, wherein compiling the register-transfer level description of the network application into the bitstream definition comprises optimizing a first TCAM-SRAM structure of the plurality of TCAM-SRAM structures by replacing the first TCAM-SRAM structure with a state machine comparison logic.

24. The method of claim 23, further comprising:

programming, by the computing device, the field-programmable gate array with the bitstream definition in response to compiling the register-transfer level description.

25. The method of claim 23, wherein compiling the register-transfer level description of the network application into a bitstream definition comprises optimizing the register-transfer level description of the network application.

* * * * *